US006001530A

United States Patent [19]

Kidnie et al.

[11] Patent Number: 6,001,530

[45] Date of Patent: Dec. 14, 1999

[54] LASER ADDRESSED BLACK THERMAL TRANSFER DONORS

[75] Inventors: Kevin M. Kidnie, St. Paul; Richard R. Ollmann, Jr., Woodbury; Richard A. Gaboury, Lakeland, all of Minn.; Gregory L. Zwadlo, Ellsworth, Wis.

[73] Assignee: Imation Corp., St. Paul, Minn.

[21] Appl. No.: 09/145,725

[22] Filed: Sep. 2, 1998

Related U.S. Application Data

[60] Provisional application No. 60/057,869, Sep. 2, 1997.

[51] Int. Cl.[6] ................................ G03F 7/34; G03C 1/73

[52] U.S. Cl. ....................... 430/201; 430/200; 430/270.1; 430/944; 430/964

[58] Field of Search .................................... 430/200, 201, 430/964, 944, 270.1

[56] References Cited

U.S. PATENT DOCUMENTS

| | | | |
|---|---|---|---|
| 3,962,513 | 6/1976 | Eames | 430/201 |
| 4,430,366 | 2/1984 | Crawford et al. . | |
| 4,541,830 | 9/1985 | Hotta et al. . | |
| 4,876,235 | 10/1989 | DeBoer . | |
| 4,880,324 | 11/1989 | Sato et al. . | |
| 4,880,686 | 11/1989 | Yaegashi et al. . | |
| 4,960,632 | 10/1990 | Tohma et al. . | |
| 5,017,547 | 5/1991 | DeBoer | 430/201 |
| 5,019,549 | 5/1991 | Kellogg et al. | 430/201 |
| 5,028,507 | 7/1991 | Kidnie . | |
| 5,053,381 | 10/1991 | Chapman et al. . | |
| 5,106,676 | 4/1992 | Sato et al. . | |
| 5,126,760 | 6/1992 | DeBoer . | |
| 5,135,842 | 8/1992 | Kitchin et al. . | |
| 5,156,938 | 10/1992 | Foley et al. | 430/201 |
| 5,171,650 | 12/1992 | Ellis et al. | 430/201 |
| 5,192,737 | 3/1993 | Kubodera et al. | 430/201 |
| 5,219,703 | 6/1993 | Bugner et al. | 430/201 |
| 5,256,506 | 10/1993 | Ellis et al. | 430/201 |
| 5,264,320 | 11/1993 | Evans et al. | 430/200 |
| 5,278,023 | 1/1994 | Bills et al. | 430/201 |
| 5,308,737 | 5/1994 | Bills et al. | 430/201 |
| 5,326,619 | 7/1994 | Dower et al. | 430/201 |
| 5,372,852 | 12/1994 | Titterington et al. . | |
| 5,380,769 | 1/1995 | Titterington et al. . | |
| 5,401,606 | 3/1995 | Reardon et al. | 430/200 |
| 5,475,418 | 12/1995 | Patel et al. . | |
| 5,501,937 | 3/1996 | Matsumoto et al. | 430/201 |
| 5,510,225 | 4/1996 | Janssens et al. | 430/200 |
| 5,516,622 | 5/1996 | Savini et al. | 430/200 |
| 5,518,861 | 5/1996 | Coveleskie et al. | 430/200 |
| 5,543,177 | 8/1996 | Morrison et al. . | |
| 5,620,508 | 4/1997 | Yamano et al. | 106/23 |
| 5,633,118 | 5/1997 | Burberry et al. | 430/201 |
| 5,633,119 | 5/1997 | Burberry et al. | 430/201 |
| 5,645,888 | 7/1997 | Titterington et al. . | |
| 5,725,993 | 3/1998 | Bringley et al. | 430/201 |
| 5,843,617 | 12/1998 | Patel et al. | 430/200 |
| 5,856,061 | 1/1999 | Patel et al. | 430/200 |

FOREIGN PATENT DOCUMENTS

| | | |
|---|---|---|
| 0745489 | 12/1996 | European Pat. Off. . |
| 0491564 | 8/1997 | European Pat. Off. . |
| 0602893 | 8/1997 | European Pat. Off. . |
| 0675003 | 9/1997 | European Pat. Off. . |
| 0530018 | 4/1998 | European Pat. Off. . |
| 51-088016 | 8/1976 | Japan . |
| 63-319192 | 12/1988 | Japan . |
| 2083726 | 3/1982 | United Kingdom . |
| WO 90/12342 | 10/1990 | WIPO . |
| WO 94/04368 | 3/1994 | WIPO . |
| WO 97/15173 | 4/1997 | WIPO . |
| WO 98/07575 | 2/1998 | WIPO . |

OTHER PUBLICATIONS

IBM Technical Disclosure Bulletin, vol. 18, No. 10, Mar. 1976, p. 3416, XP002085934, New York, US.

*Primary Examiner*—Richard L. Schilling

[57] ABSTRACT

A black donor for use in a laser addressable thermal transfer system, wherein the black donor comprises a substrate having coated thereon at least one black color layer comprising a binder and colorants. The colorants include a non-infrared absorbing black dye or pigment and about 10% to about 50% of a carbon black pigment, based on the total weight of the colorants in the black color layer.

20 Claims, 3 Drawing Sheets

LASER ADDRESSED BLACK THERMAL TRANSFER DONORS

CROSS-REFERENCE TO RELATED APPLICATION

The present invention claims priority from U.S. Provisional Patent Application Ser. No. 60/057869, filed on Sep. 2, 1997, which is incorporated herein by reference.

FIELD OF THE INVENTION

The present invention relates to a black thermal transfer media for use in an image recorder equipped with an infrared laser to produce a black portion of an image. In particular, the present invention relates to black media wherein the black colorants have reduced interference with the infrared imaging radiation (e.g., as through absorbance or scattering) giving rise to improved image quality.

BACKGROUND

In the imaging arts, elements that can be imagewise exposed by means of light radiation are well known. The availability of infrared laser diodes has provided a convenient means of generating images onto a variety of substrates using a laser scanner. In particular, laser thermal transfer systems have gained significant attention over the past decade. In a typical laser thermal transfer system, a donor sheet comprising a layer of an infrared absorbing transfer medium is placed in contact with a receptor, and the assembly is exposed to a pattern of infrared (IR) radiation. Absorption of the IR radiation causes a rapid build-up of heat in the exposed areas which in turn causes transfer of the medium from the donor to the receptor to form an image. This transfer can result, for example, from sublimation (or diffusion), ablative transfer, film transfer, or mass transfer.

Sublimation or diffusion transfer systems involve a mechanism wherein a colorant is sublimed (or difflused) to the receptor without co-transfer of the binder. This process enables the amount of colorant transferred to vary continuously with the input of radiation energy. Examples of this type of process are discussed in JP 51-088016; GB 2,083,726; as well as U.S. Pat. Nos. 5,126,760; 5,053,381; 5,017,547 and 4,541,830.

In an ablative thermal transfer system, the exposed transfer medium is propelled from the donor to a receptor by generation of a gas. Specific polymers are selected which decompose upon exposure to heat to rapidly generate a gas. The build-up of gas under or within the transfer media acts as a propellant to transfer the media to the receptor. Examples of various laser ablative systems may be found in U.S. Pat. Nos. 5,516,622; 5,518,861; 5,326,619; 5,308,737; 5,278,023; 5,256,506; 5,171,650; 5,156,938; 3,962,513; and WO 90/12342.

In a mass-transfer system, the colorant and associated binder materials transfer in a molten or semi-molten state (melt-stick transfer) to a receptor upon exposure to the radiation source. The thermal transfer media sticks to the receptor surface with greater strength than it adheres to the donor surface resulting in physical transfer of the media in the imaged areas. There is essentially 0% or 100% transfer of colorant depending on whether the applied energy exceeds a certain threshold. Examples of these types of systems may be found in JP 63-319192; JP 69-319192; WO 97/15173; EP 530018; EP 602893; EP 675003; EP 745489; U.S. Pat. Nos. 5,501,937; 5,401,606 and 5,019,549.

In laser-induced film transfer (LIFT), the donor sheets contain a crosslinking agent that reacts with a binder imaging to form a high molecular weight network. The net effect of this crosslinking is better control of melt flow phenomena, transfer of more cohesive material to the receptor, and higher quality dots. Examples of this type of system may be found in U.S. patent application Ser. No. 08/842,151, filed on Apr. 22, 1997.

Ideally, the transfer media absorbs at a wavelength different from the imaging radiation. However, black colorants typically absorb over a broad range of wavelengths making it difficult to formulate a black donor that does not interfere with the imaging radiation. Absorption of infrared radiation by black colorants is particularly troublesome since the absorption of the infrared radiation causes additional heat generation which leads to poor image quality or in some cases may destroy the imaging media. Therefore, there is a need for a black formulation that does not interfere significantly with infrared imaging sources.

SUMMARY

The present invention provides a black donor for use in a laser addressable thermal transfer system. The black donor comprises a substrate having coated thereon at least one black color layer comprising a binder and colorants, wherein the colorants comprise a black non-infrared absorbing dye or pigment and about 10% to about 50% carbon black pigment, based on the total weight of the colorants. Typically, the black color layer includes an infrared absorber, although this is not necessarily a requirement as the infrared absorber can be part of another layer.

This combination of a carbon black pigment and a black non-infrared absorbing dye or pigment provides significant advantage. For example, it does not significantly interfere, as by absorbing or scattering, with infrared imaging sources. Thus, the amount of heat generated can be reduced, thereby resulting in better image quality.

The present invention also provides a laser addressable thermal transfer system comprising a receptor and a black donor, wherein the black donor comprises a substrate having coated thereon at least one black color layer comprising a binder and colorants, wherein the colorants comprise a non-infrared absorbing black dye or pigment and about 10% to about 50% of a carbon black pigment, based on the total weight of the colorants in the black color layer.

The present invention further provides a method of forming a black image. The method includes assembling in mutual contact a receptor and a black donor, the black donor comprising a substrate having coated thereon at least one black color layer comprising a binder and colorants, wherein the colorants comprise a non-infrared absorbing black dye or pigment and about 10% to about 50% of a carbon black pigment, based on the total weight of the colorants in the black color layer; exposing the assembly to laser radiation to transfer a black image from the donor to the receptor in irradiated areas; and separating the donor and receptor.

DETAILED DESCRIPTION OF PREFERRED EMBODIMENTS

Figure 1:
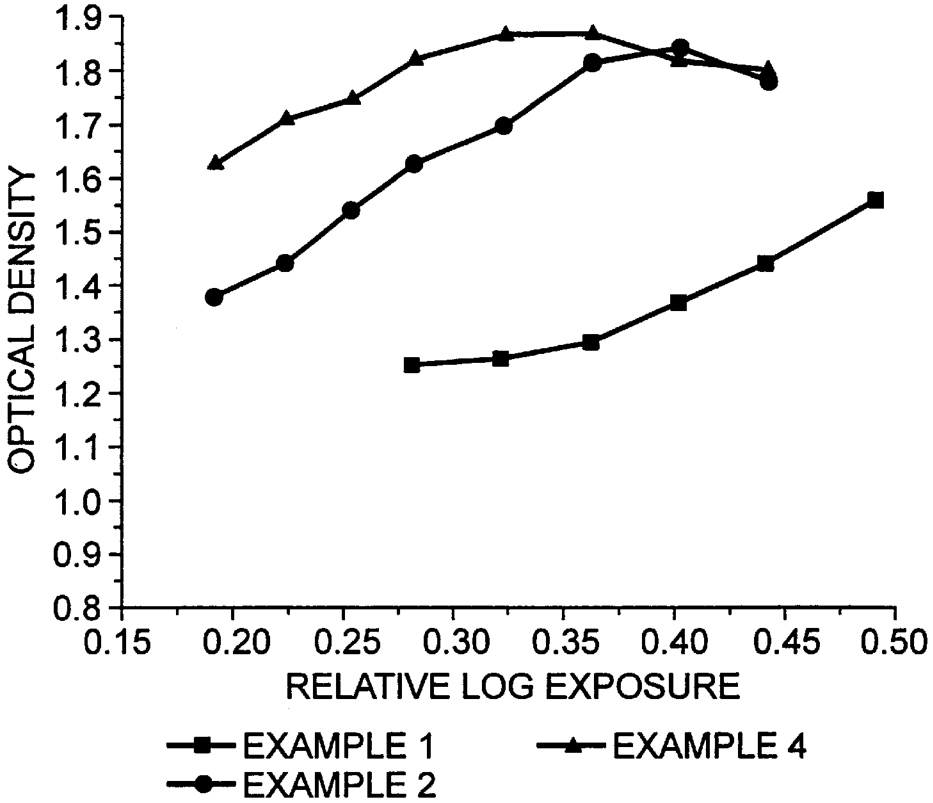
FIG. 1 is a graph showing the formulation effect on sensitivity.
Figure 2:
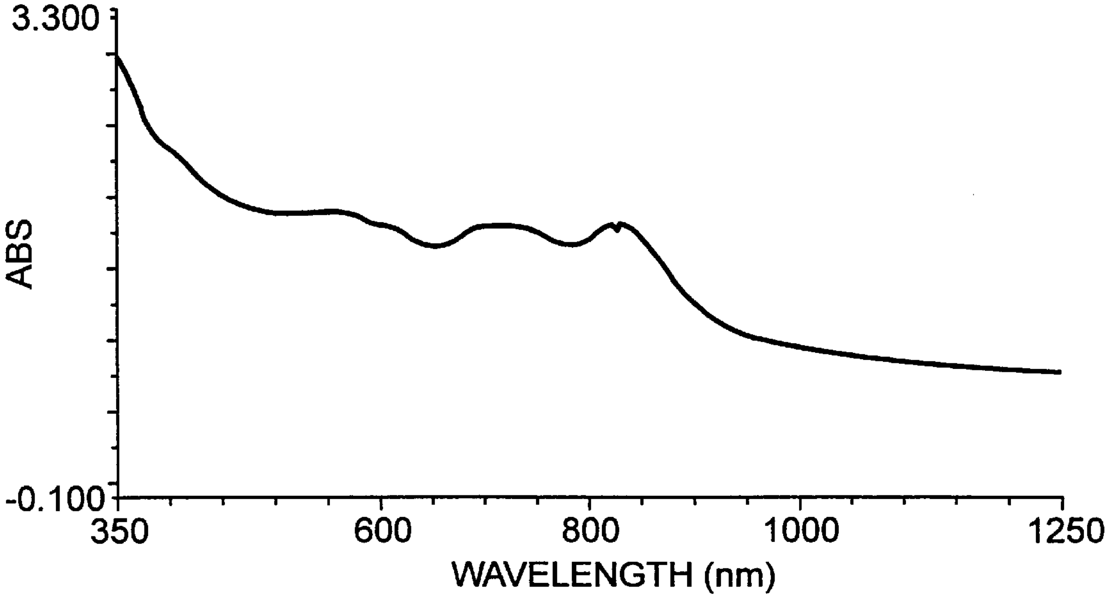
FIG. 2 is an absorption spectra of the Black donor described in comparative Example 1 where about 80% by weight of the total colorant component in the color layer is carbon black.
Figure 3:
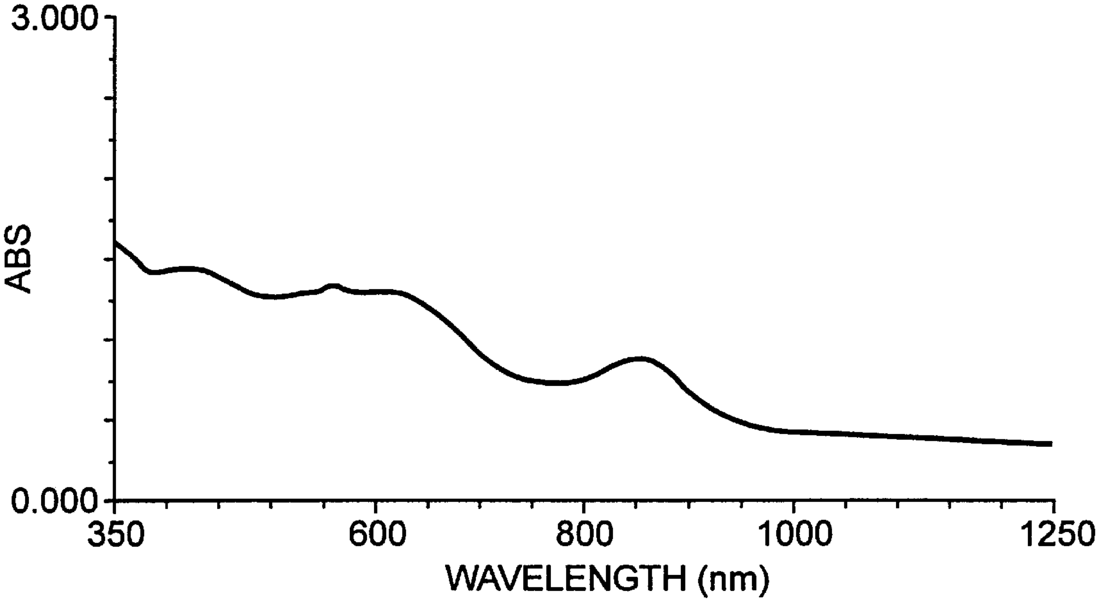
FIG. 3 is an absorption spectra of the Black donor described in Example 2 where about 40% by weight of the total colorant component in the color layer is carbon black.
Figure 4:
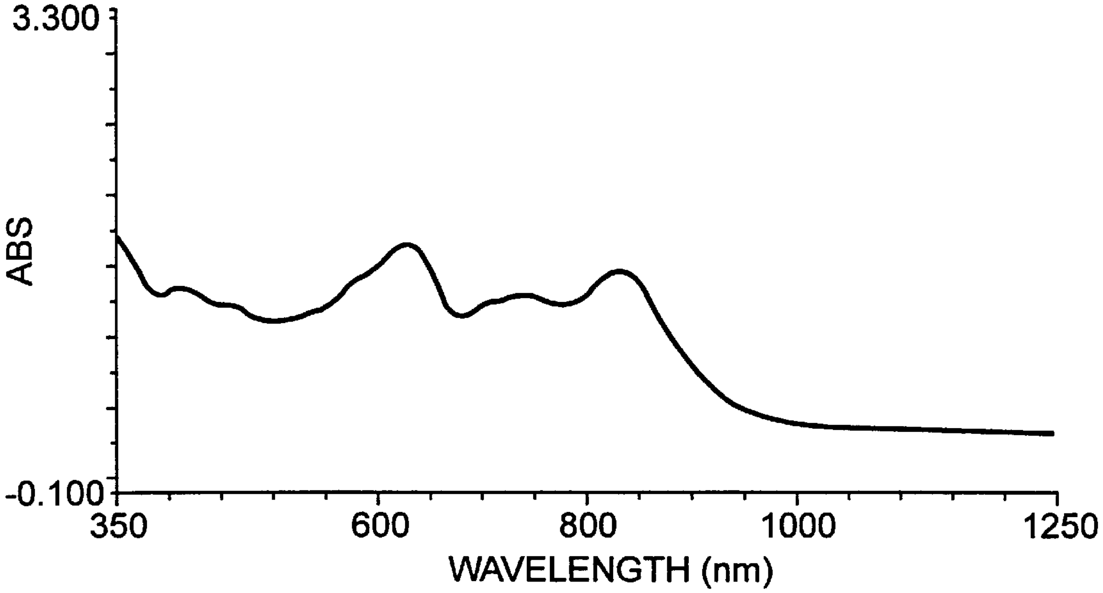
FIG. 4 is an absorption spectra of the Black donor described in Example 3 where about 25% by weight of the total colorant component in the color layer is carbon black.
Figure 5:
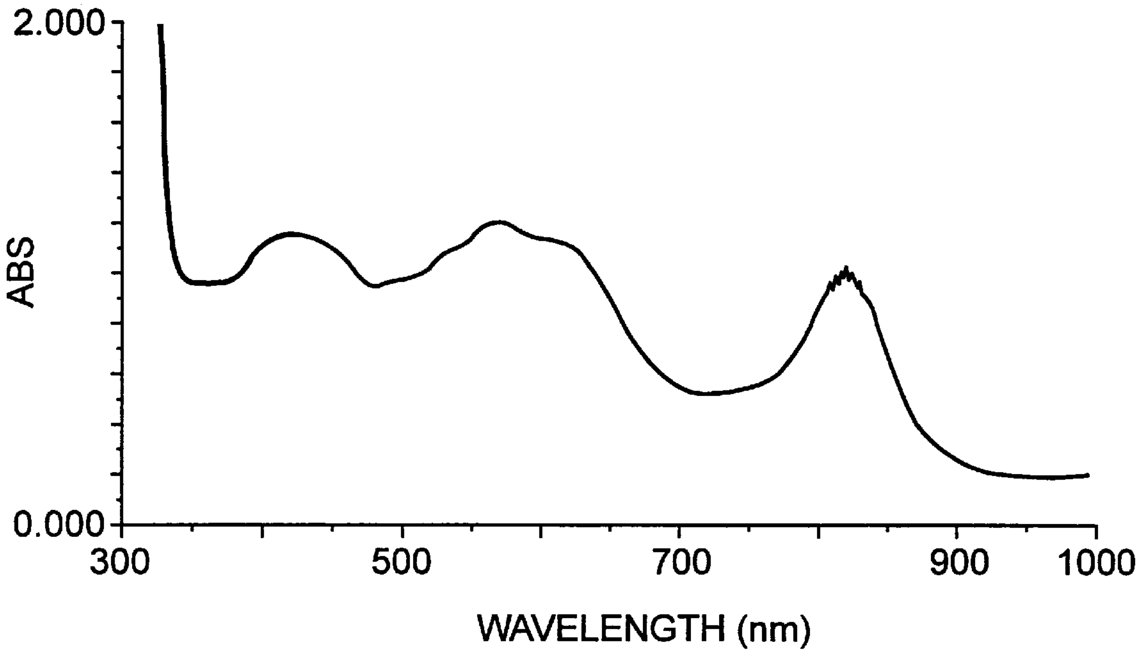
FIG. 5 is an absorption spectra of the Black donor described in Example 4 where about 12% by weight of the total colorant component in the color layer is carbon black.

A black donor element is provided comprising a substrate having coated thereon at least one layer containing a black colorant(s) and an infrared (IR) absorber (also referred to herein as a light-to-heat conversion material). The black colorant(s) and IR absorber may be in the same layer(s) or separate layers. The IR absorber may also be present in the receptor in addition to the donor or instead of the donor as disclosed in International Patent Application No. WO 94/04368. Other layers may be present, such as dynamic release layers as disclosed in U.S. Pat. No. 5,171,650. Alternatively, the donor may be self-supporting as disclosed in EP 0491564.

The substrate is preferably a transparent polymeric film such as those made of polyesters (e.g., polyethylene terephthalate, polyethylene naphthalate), fluorene polyester polymer consisting essentially of repeating interpolymerized units derived from 9,9-bis(4-hydroxyphenyl)fluorene and isophthalic acid, terephthalic acid or mixtures thereof, polyethylene, polypropylene, polyvinyl chloride and copolymers thereof, and hydrolyzed and unhydrolyzed cellulose acetate.

As used herein, the term "black dye or pigment" is defined to include dyes and pigments that absorb energy relatively equally at substantially all wavelengths across the visible spectrum (typically, about 350 nm to about 750 nm). An example of a black dye or pigment that absorbs across the entire visible spectrum is carbon black, however, it also absorbs significantly in the infrared region of the spectrum as well. The term "black dye or pigment" also includes dyes and pigments that absorb wavelengths differentially across the entire visible spectrum. Such dyes or pigments may actually be referred to as "black," but may actually be a very deep blue, for example. Furthermore, the term "black dye or pigment" includes mixtures of dyes and/or pigments that individually may or may not be black but when mixed together provide a neutral black color. For example, Example 3 contains a mixture of "NEPTUN" Black, Blue Shade Magenta, and Red Shade Yellow Pigment, which provide a neutral black color. As used herein, the term "non-infrared absorbing" black dye or pigment is defined to include dyes or pigments that have minimal absorptions in the infrared region of the spectrum (typically, about 750 nm to about 1000 micrometers). Although this means that the black dyes or pigments absorb little or no energy in the infrared spectrum, they may absorb a small amount as long as there is little or no interference with the infrared absorbing source. Preferably, non-infrared absorbing black dyes or pigments absorb less than about 0.5 absorbance unit, and more preferably, less than about 0.1 absorbance unit, at use concentrations, in the infrared region of the spectrum. Examples of "non-infrared absorbing" black dyes and pigments include, for example, "NEPTUN" Black X60, "PALIOGEN" Black S 0084 and Microlith Violet B-K.

The black color layer includes one or more dyes or pigments dissolved or dispersed in a binder; however, binder-free color layers are also possible (see, for example, International Patent Application No. WO 94/04368). Typically carbon black is used as the primary colorant because of its neutral color and covering power; however, black donors based primarily on carbon black dispersions are difficult to formulate due to inherent absorption of the carbon black particles. Overheating of the carbon black within the color transfer layer results in loss of density or increased diffusion of the transferred image. Diffusion of the transferred image causes poor image quality and resolution. Applicants have discovered that by incorporating one or more black dyes or pigments having minimal absorptions at wavelenghs greater than about 750 nm, and preferably, greater than about 800 nm (in combination with carbon black) into the black color layer reduces the interference with the imaging radiation and improves the image quality and resolution. Even though the concentration of carbon black is reduced significantly, acceptable color neutrality and covering power is maintained. The weight percent of carbon black added to the color layer is preferably about 10% to about 50% of the total weight of the black colorants added, more preferably, about 10% to about 40%, and most preferably, about 10% to about 30%.

Suitable carbon black pigments include "RAVEN" 450, 760 ULTRA, 890, 1020, 1250, and others available from Columbian Chemicals Co., Atlanta, Ga., as well as Black Pearls 170, Black Pearls 480, Vulcan XC72, Black Pearls 1100, and others available from Cabot Corp., Waltham, Mass.

Suitable non-infrared absorbing black dyes or pigments include "NEPTUN" Black X60 (C.I. Solvent Black 3, CAS Reg. No. 4197-25-5, available from BASF Corporation, Charlotte, N.C.); "PALIOGEN" Black S 0084 (C.I. Pigment Black 31, CAS Reg. No. 67075-37-0, available from BASF); Microlith Violet B-K (C.I. Pigment Violet 37, CAS Reg. No. 17741-63-8, available from CIBA Corp., Newport, Del.); "ORASOL" Black (C.I. Solvent Black 28, CAS Reg. No. 12237-23-9, and C.I. Solvent Black 29, CAS Reg. No. 61901-87-9, available from Ciba-Geigy Corp., Chemicals Div., Greensboro, N.C.); "NIGROSINE" Black (C.I. Acid Black 2, CAS Reg. No. 8005-03-6, and C.I. Solvent Black 5, CAS Reg. No. 11099-03-9, available from Pylam Products Co., Inc., Garden City, N.Y.); "PALIOTOL" Black K0080, available from BASF); "SANDOLAN" Black E-HL (available from Sandoz, Charlote, N.C.); "NEAZOPAN" Black L 0080 (available from BASF); Atlantic Diazo Black OB Supra (available from Pylam); and "SOLANTINE" Black L (available from Pylam).

When used in a color proofing application, the black color layer preferably comprises one or more dyes or pigments that reproduce a black color which matches the black standard for web offset printing (SWOP) provided by the International Prepress Proofing Association or other recognized black color standards in the printing industry.

The infrared absorber must be capable of converting the imaging radiation to heat. Hence, it is also referred to as a light-to-heat conversion (or converting) material. The light-to-heat conversion material may be in a separate light-to-heat conversion layer or alternatively, a dispersion of light-to-heat converting material in the same layer as the colorant. Any light-to-heat conversion material may be utilized in the donor construction including, but not limited to, composites containing radiation-absorbing pigments or dyes, radiation absorbing thin metal films, thin metal oxide films, thin metal sulfide films, etc. For example, U.S. Pat. No. 4,430,366 describes a process for forming an aluminum oxide layer that may be used as a separate light-to-heat conversion layer. Useful infrared-absorbing pigments or dyes are well-known by those who practice in the art. Some examples of useful infrared-absorbing pigments or dyes include tetraarylpolymethine (TAPM) dyes, squarlium dyes (such as those described in U.S. Pat. No. 5,019,549), aniline and phenylenediamine dyes (such as those described in U.S. Pat. No. 5,192,737), cyanine dyes "CYASORB" IR 165, 126 or 99 (commercially available from Glendale Protective Technologies, Lakeland, Fla.). Particularly useful light-to-heat conversion materials are the tetraarylpolymethine (TAPM) dyes such as those described in U.S. Pat. No. 5,135,842 which are represented by the following formula:

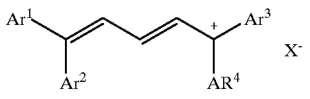

wherein $Ar^1$ to $Ar^4$ are aryl groups which may be the same or different such that a maximum of three of the aryl groups represented by $Ar^1$ to $Ar^4$ bear a tertiary amino substituent (preferably in the 4-position), and X is an anion. Preferably at least one, but no more than two, of said aryl groups bear a tertiary amino substituent. The aryl groups bearing tertiary amino substituents are preferably attached to different ends of the polymethine chain i.e., $Ar^1$ or $Ar^2$ and $Ar^3$ or $Ar^4$ bear the tertiary amine substituents. Useful tertiary amino groups include dialkylamino groups (such as dimethylamino, diethylamino, etc.), diarylamino groups (such as diphenylamino), alkylarylamino groups (such as N-methylanilino), and heterocyclic groups such as pyrrolidino, morpholino or piperidino. The tertiary amino group may form part of a fused ring system, e.g., one or more of $Ar^1$ to $Ar^4$ may represent ajulolidine group.

The aryl groups represented by $Ar^1$ to $Ar^4$ include phenyl, naphthyl, or other fused ring systems, but phenyl rings are preferred. In addition to the tertiary amino groups discussed previously, substituents which may be present on the rings include alkyl groups (preferably of up to 10 carbon atoms), halogen atoms (such as Cl and Br), hydroxy groups, thioether groups and alkoxy groups. Substituents which donate electron density to the conjugated system, such as alkoxy groups, are particularly preferred. Substituents, especially alkyl groups of up to 10 carbon atoms or aryl groups of up to 10 ring atoms, may also be present on the polymethine chain.

Preferably the anion X is derived from a strong acid (e.g., HX should have a pKa of less than 3, preferably less than 1). Suitable identities for X include $ClO_4$, $BF_4$, $CF_3SO_3$, $PF_6$, $AsF_6$, $SbF_6$ and perfluoroethylcyclohexylsulphonate.

TAPM dyes may be synthesized by commonly known methods, e.g., by conversion of the appropriate benzophenones to the corresponding 1,1-diarylethylenes (by the Wittig reaction), followed by reaction with a trialkyl orthoester in the presence of strong acid HX. Preferred TAPM dyes generally absorb in the 700 nm to 900 nm region, making them suitable for infrared diode lasers.

Infrared absorbing materials commonly absorb into the visible region of the spectrum, thus causing unwanted color. To eliminate this problem, several different processes are well-known in the art including the addition of bleaching agents to the layer(s) containing the infrared absorbing materials. The bleaching agent is selected based on its ability to bleach the particular infrared absorber used in the construction and is well-known to those skilled in the art. For example, U.S. Pat. No. 5,219,703 describes a class of photoacid generators which bleach specific near-infrared sensitizers. When TAPM dyes are used, dihydropyridine derivatives, such as those disclosed in Patel et al., U.S. Ser. No. 08/619,448, now abandoned titled "Laser Absorbable Photobleachable Compositions," have proven to be useful bleaching agents.

A preferred donor element comprises a fluorocarbon compound in addition to the black colorant and binder in the color layer as described in Patel et al., U.S. Ser. No. 08/489,822 titled "Thermal Transfer Elements."

The color layer is formulated to be appropriate for the corresponding imaging application (e.g., color proofing, graphic art masks, printing plates, color filters, etc.). In many product applications, the color layer materials are preferably crosslinked either before, after or in conjunction with laser transfer in order to improve performance of the imaged article. Additives included in the color layer will again be specific to the end-use application (e.g., photoinitiators and monomers or oligomers) and are well known to those skilled in the art.

A preferred crosslinking resin system is described in co-pending U.S. patent application Ser. No. 08/842,151 titled "Laser Induced Film Transfer System," and comprises a resin having a plurality of hydroxyl groups in reactive association with a latent curing agent having the following formula:

I

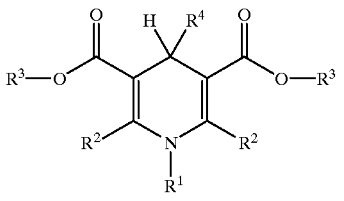

wherein $R^1$ represents H, an alkyl group, a cycloalkyl group or an aryl group; each $R^2$ independently represents an alkyl group or an aryl group; each $R^3$ independently represents an alkyl group or an aryl group; and $R^4$ represents an aryl group. $R^1$ preferably is any group compatible with formation of a stable pyridinium cation, which includes essentially any alkyl, cycloalkyl or aryl group, but for reasons of cost and convenience, simple alkyl groups (such as methyl, ethyl, propyl etc.) or simple aryl groups (such as phenyl, tolyl, etc.) are preferred.

Similarly, $R^2$ may represent essentially any alkyl or aryl group, but lower alkyl groups (such as methyl, ethyl, etc.) are preferred for reasons of cost and ease of synthesis. $R^3$ may also represent any alkyl or aryl group, but is preferably selected so that the corresponding alcohol or phenol, $R^3$—OH is a good leaving group, as this promotes the transesterification reaction believed to be central to the curing mechanism. Thus, aryl groups comprising one or more electron-attracting substituents such as nitro, cyano, or fluorinated substituents, or alkyl groups of up to 10 carbon atoms are preferred. Most preferably, each $R^3$ represents an alkyl group such as methyl, ethyl, propyl, etc., such that $R^3$—OH is volatile at temperatures of about 100° C. and above. $R^4$ may represent any aryl group such as phenyl, naphthyl, etc., including substituted derivatives thereof, but is most conveniently phenyl. Analogous compounds where $R^4$ represents H or an alkyl group are not suitable because such compounds react at ambient or moderately elevated temperatures with many of the infrared absorbers resulting in a limited shelf life.

The resin having a plurality of hydroxy groups, may be selected from a wide variety of materials. Prior to laser address, the media ideally is in the form of a smooth, tack-free coating, with sufficient cohesive strength and durability to resist damage by abrasion, peeling, flaking, dusting, etc. in the course of normal handling and storage. Thus, film-forming polymers with glass transition temperatures higher than ambient temperature are preferred. In addition, preferred hydroxy-functional polymers are capable of dissolving or dispersing the other components of the transfer media, and themselves are soluble in the typical coating solvents such as lower alcohols, ketones, ethers, hydrocarbons, haloalkanes and the like. Preferred hydroxy-functional resins are polymers formed by reacting poly(vinyl alcohol) with butyraldehyde i.e., "BUTVAR" B-76 (available from Monsanto, St. Louis, Mo.) which contains at least 5% unreacted hydroxyl groups.

The image receptor may be any material suitable for the particular application including, but not limited to, papers, transparent films, active portions of LCD displays, metals, etc. One or more layers may be coated onto the image receptor to facilitate transfer of the color layer to the receptor. The coatings may optionally contain a thermal bleaching agent and/or an IR absorber as disclosed in International Patent Application No. WO 94/04368. Suitable thermal bleaching agents non-exclusively include guanidine derivatives, dihydropyridine derivatives (such as those described above), amine salts of arylsulphonylacetates and quaternary ammonium nitrophenyl- sulphonylacetates. The characteristics of the resin (i.e., Molecular weight, $T_g$, and $T_m$) for the receptor topcoat may depend on the type of transfer involved (e.g., ablation, melt-stick, or sublimation). For example, to promote transfer by the melt-stick mechanism, it may be advantageous to employ similar or identical resins for both the receptor topcoat and the binder of the colorant donor layer. In a preferred thermal transfer system, "BUTVAR" B76 (polyvinyl butyral available from Monsanto), Pliolite S5A (polystyrene/butadiene resin available from Goodrich) and similar thermoplastic resins are highly suitable receptor topcoat materials. The surface of the receptor topcoat may be smooth or rough. Roughened surfaces may be accomplished by incorporating into the topcoat of the receptor inert particles, such as silica or polymeric beads (see i.e., GB 2,083,726 and U.S. Pat. No. 4,876,235).

When the bleaching agent is present initially in the receptor, the amount of bleaching agent employed may vary considerably, depending on the concentration and characteristics of the IR absorber used, e.g., its propensity for co-transfer with the colorant, the intensity of its visible coloration, etc. Generally, loadings of about 2 weight percent (wt %) to about 25 wt % of the solids in the receptor layer are suitable, and normally loadings are about 5 wt % to about 20 wt %.

Imagewise transfer of the black colorant from the donor to the receptor may be accomplished using conventional laser addressable procedures that are well-known to those skilled in the art. In a typical system, the donor and receptor are assembled in intimate face-to-face contact, e.g., by vacuum hold down or alternatively by means of a cylindrical lens apparatus such as the apparatus described in U.S. Pat. No. 5,475,418, and the assembly scanned by a suitable laser. The assembly may be imaged by any of the commonly used infrared or near-infrared lasers (i.e., laser diodes and YAG lasers). Any of the known scanning devices may be used, e.g., flat-bed scanners, external drum scanners or internal drum scanners. In these devices, the assembly to be imaged is secured to the drum or bed, e.g., by vacuum hold-down, and the laser beam is focused to a spot, e.g., of about 20 microns diameter, on the IR-absorbing layer of the donor-receptor assembly. This spot is scanned over the entire area to be imaged while the laser output is modulated in accordance with electronically stored image information. Two or more lasers may scan different areas of the donor receptor assembly simultaneously, and if necessary, the output of two or more lasers may be combined optically into a single spot of higher intensity. Laser addr ess is normally from the donor side, but may be from the receptor side if the receptor is transparent to the laser radiation.

The following non-limiting examples further illustrate the present invention.

EXAMPLES

The following trademarks are representative of the corresponding listed materials:

"BUTVAR" B-76 is a polyvinyl butyral available from Monsanto, St. Louis, Mo.

"NEPTUN" Black X60 (C.I. Solvent Black 3, CAS Reg. No. 4197-25-5,) and

"PALIOGEN" Black S0084 (C.I. Pigment Black 31, CAS Reg. No.67075-37-0) are both available from BASF Corporation, Charlotte, N.C.

"DISPERBYK" 161 is a dispersing agent available from BYK-Chemie.

"PLIOLITE" S-5A is a styrene/butadiene resin available from Goodrich.

Fluorocarbon Surfactant is a 55/35/10 terpolymer of a fluorinated acrylate/short chain alkyl acrylate/polar monomer.

Infrared Absorbing Dye (D1) has the following structure:

D1

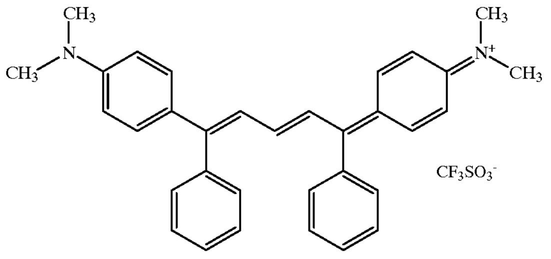

Dihydropyridine derivative C1 has the following structure:

C 1

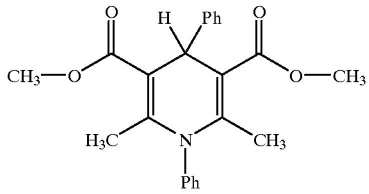

All other materials are available from Aldrich Chemicals, Milwaukee, Wis. The following black donor was constructed for comparison to the donors of Examples 2, 3, and 4.

Example 1 (Comparative)

A black coating solution was prepared by combining and mixing the components listed below in the corresponding amounts:

| | |
|---|---|
| Carbon Black Millbase (20.8% T.S. in MEK: 47.52% carbon black pigment, 47.52% "BUTVAR" B-76, and 4.95% "DISPERBYK" 161) | 509.02 g |
| Red Shade Cyan Millbase (16.0% T.S. in MEK: 48.54% Red Shade Cyan pigment, 48.54% "BUTVAR" B-76, and 2.91% "DISPERBYK" 161) | 130.64 g |
| Blue Shade Magenta Millbase (14.8% T.S. in MBK: 47.17% Blue Shade Magenta, 47.17% "BUTVAR" B-76, and 5.65% "DISPERBYK" 161) | 40.28 g |
| "BUTVAR" B-76 (10% T.S. in MEK) | 249.66 g |
| Infrared Absorbing Dye D1 | 13.30 g |
| Dihydropyridine derivative C1 | 11.40 g |
| Fluorocarbon surfactant (7.5% T.S. in MEK) | 13.33 g |
| N-ethylperfluorooctylsulphonamide (50% T.S. in MEK) | 15.20 g |
| MEK (Methyl ethyl ketone) | 877.45 g |
| Ethanol | 180.00 g |

The black coating solution was coated at an appropriate wet coating weight onto a polyester substrate and dried to achieve the desired optical density.

Example 2

Example 2 shows the effect of adding Neptun K pigment to a black color layer formulation and reducing the carbon black component of the total colorant concentration to 40% by weight. A black coating solution was prepared by combining and mixing the components listed below in the corresponding amounts:

| | |
|---|---|
| Carbon Black Millbase (20.8% T.S. in MEK: 47.52% carbon black pigment, 47.52% "BUTVAR" B-76, and 4.95% "DISPERBYK" 161) | 10.59 g |
| Blue Shade Magenta Millbase (14.8% T.S. in MBK: 48.54% Blue Shade Magenta, 48.54% "BUTVAR" B-76, and 2.91% "DISPERBYK" 161) | 5.36 g |
| "NEPTUN" K Millbase (18.4% T.S. in MEK: 48.54 % "NEPTUN" Black, 48.54% "BUTVAR" B-76, and 2.91% "DISPERBYK" 161) | 10.60 g |
| Red Shade Yellow Millbase (15.7% T.S. in MEK: 48.54% Red Shade Yellow pigment, 48.54% "BUTVAR" B-76, and 2.91% "DISPERBYK" 161) | 3.44 g |
| "BUTVAR" B-76 (10% T.S. in MEK) | 2.95 g |
| Infrared Absorbing Dye D1 | 0.60 g |
| Dihydropyridine derivative C1 | 0.42 g |
| Fluorocarbon surfactant (7.5% T.S. in MEK) | 0.67 g |
| N-ethylperfluorooctylsulphonamide. (50% T.S. in MEK) | 0.41 g |
| MEK (Methyl ethyl ketone) | 56.96 g |
| Ethanol | 8.00 g |

The black coating solution was coated at an appropriate wet coating weight onto a polyester substrate and dried to achieve the desired optical density.

Example 3

Example 3 shows the effect of adding Paliogen K pigment to a black color layer formulation and reducing the carbon black component of the total colorant concentration to 25% by weight. A black coating solution was prepared by combining and mixing the components listed below in the corresponding amounts:

| | |
|---|---|
| Carbon Black Millbase (20.8% T.S. in MEK: 47.52% carbon black pigment, 47.52% "BUTVAR" B-76, and 4.95% "DISPERBYK" 161) | 7.69 g |
| Red Shade Cyan Millbase (16.0% T.S. in MEK: 48.54% Red Shade Cyan pigment, 48.54% "BUTVAR" B-76, and 2.91% "DISPERBYK" 161) | 6.24 g |
| "PALIOGEN" Black Millbase (11.9% T.S. in MEK: 47.17% "PALIOGEN" Black pigment, 47.17% "BUTVAR" B-76, and 5.65% "DISPERBYK" 161) | 32.24 g |
| "BUTVAR" B-76 (10% T.S. in MEK) | 11.67 g |
| Infrared Absorbing Dye D1 | 0.76 g |
| Dihydropyridine derivative C1 | 0.76 g |
| Fluorocarbon surfactant (7.5% T.S. in MEK) | 0.67 g |
| N-ethylperfluorooctylsulphonamide. (50% T.S. in MEK) | 0.76 g |
| MEK (Methyl ethyl ketone) | 30.22 g |
| Ethanol | 9.00 g |

The black coating solution was coated at an appropriate wet coating weight onto a polyester substrate and dried to achieve the desired optical density.

Example 4

Example 4 shows the effect of adding "NEPTUN" K pigment and Microlith Violet B-K to a black layer formulation and reducing the carbon black component of the total colorant concentration to 14% by weight. A black coating solution was prepared by combining and mixing the components listed below in the corresponding amounts:

| | |
|---|---|
| Carbon Black Millbase (21.3% T.S. in MBK/SOLV PM 50/50: 47.52% carbon black pigment, 47.52% "BUTVAR" B-76 and 4.95% "DYSPERBYK" 161) | 4.04 g |
| Violet-BK Millbase (9.6% T.S. in MEK: 100% Microlith Violet-BK) | 8.59 g |
| "NBPTUN" K Millbase (15.2% T.S. in MEK: 100% "NEPTUN" K) | 7.58 g |
| Red Shade Yellow Millbase (16.4% T.S. in MEK/SOLV PM 50/50: 48.54% Red Shade Yellow pigment, 48.54% "BUTVAR" B-76, and 2.91% "DISPERBYK" 161) | 11.79 |
| "BUTVAR" B-76 (10% T.S. in MEK) | 3.29 g |
| Infrared Absorbing Dye D1 | 0.45 g |
| Dihydropyridine derivative C1 | 0.42 g |
| Fluorocarbon surfactant (7.5% T.S. in MEK) | 0.67 g |
| N-ethylperfluorosulphonamide (50% T.S. in MEK) | 0.41 g |
| MEK (Methyl Ethyl Ketone) | 47.00 g |
| Ethanol | 8.00 g |
| Solv PM (Propylene glycol-Monomethyl Ether) | 8.00 g |

The black coating solution was coated at an appropriate wet coating weight onto a polyester substrate and dried to achieve the desired optical density.

The black donors of Examples 1–4 were put in intimate contact with a receptor made by coating a solution containing 80.4 g of MEK, 15.7 g of "PLIOLITE" S-5A, 2.2 g of diphenylguanidine and 1.8 g of 8 micron polystearylmethacrylate beads (10% T.S. in MEK) onto a polyester substrate and dried. The composite was assembled and imaged in a Presstek "PEARLSETTER" (imaging wavelength=915 nm) laser imager. Similar results can be obtained using a laser imager having an imaging wavelength of 830 nm.

The transferred half-tone dot images of Examples 2, 3 and 4 showed substantial improvement in image quality in comparison to the comparative Example. The delta E values were measured on a Gretag SPM-100 spectrophotometer using a "MATCHPRINT" Black color as a reference. Table 1 summarizes the results observed.

TABLE 1

| Ex. No. | Weight Percent Carbon Black | L* | a* | b* | Delta E | ROD[1] | Absorption at 915 nm |
|---|---|---|---|---|---|---|---|
| Comp. 1 | 80% | 19.3 | −2.9 | −3.3 | 2.9 | 1.57 | 1.2 |
| 2 | 40% | 14.7 | −3.7 | −2.5 | 1.9 | 1.75 | 0.6 |
| 3 | 25% | 16.7 | −1.7 | −0.5 | 2.3 | 1.66 | 0.7 |
| 4 | 12% | 13.3 | −1.1 | 1.35 | 1.7 | 1.79 | 0.5 |

[1]ROD refers to reflective optical density.

Table 1 demonstrates that the absorption at 915 nm can be significantly reduced without detrimentally affecting the reflective optical density or the delta E. In fact, Examples 2, 3, and 4 show that even higher RODs may be achieved by using the "NEPTUN", "PALIOGEN", and "NEPTUN" K pigment combined with Microlith Violet B-K black pigment, respectively. Examples 2–4 demonstrated significantly better image quality and better color match (lower delta E) than Comparative Example 1, which had significantly higher carbon black content.

FIG. 1 shows data obtained using a Creo "TRENDSETTER" Platemaker with a 10 watt laser having an imaging wavelength of 830 nm. Comparative Example 1 is the standard carbon black formulation, which shows low sensitivity and low maximum optical density due to distortion of the transferred deposit. Example 2 is the "NEPTUN" dye plus black violet dye formulation, which shows the best sensitivity and least disortion of the image in both the solid imaged areas and in the halftone dots.

FIGS. 2–5 represent UV/NIR spectrophotometer traces for each of the black donor sheets produced in Example 1, 2, 3, and 4, respectively. The absorption spectra clearly indicate a reduction in absorption at wavelengths greater than 750 nm (and preferably, 800 nm), which corresponds to the output of the most commonly used laser diodes in infrared and near-infrared imaging devices, due to a reduction in the amount of carbon black for Examples 2–4.

All patents, patent applications, and publications disclosed herein are hereby incorporated by reference as if individually incorporated. It is to be understood that the above description is intended to be illustrative, and not restrictive. Various modifications and alterations of this invention will become apparent to those skilled in the art from the foregoing description without departing from the scope and the spirit of this invention, and it should be understood that this invention is not to be unduly limited to the illustrative embodiments set forth herein.

What is claimed is:

1. A black donor for use in a laser addressable thermal transfer system, wherein the black donor comprises a substrate having coated thereon at least one black color layer comprising a binder, a non-carbon black pigment infrared absorber, and colorants, wherein the colorants comprise a non-infrared absorbing black dye or pigment and about 10% to about 50% of a carbon black pigment, based on the total weight of the colorants in the black color layer.

2. The black donor of claim 1 wherein the non-carbon black infrared absorber comprises a tetraarylpolymethine dye.

3. The black donor of claim 1 wherein the total colorant concentration of carbon black in the black color layer is no greater than about 40% by weight.

4. The black donor of claim 2 wherein the total colorant concentration of carbon black in the black color layer is no greater than about 30% by weight.

5. The black donor of claim 1 wherein the binder comprises a resin having a plurality of hydroxyl groups.

6. The black donor of claim 4 wherein the black color layer further comprises a latent curing agent.

7. The black donor of claim 1 wherein the black color layer further comprises a fluorocarbon compound.

8. The black donor of claim 1 wherein the black color layer comprises a mixture of carbon black pigments.

9. The black donor of claim 1 wherein the non-infrared absorbing black dye or pigment comprises a mixture of dyes and/or pigments.

10. A laser addressable thermal transfer system comprising a receptor and a black donor, wherein the black donor comprises a substrate having coated thereon at least one black color layer comprising a binder, a non-carbon black pigment infrared absorber, and colorants, wherein the colorants comprise a non-infrared absorbing black dye or pigment and about 10% to about 50% of a carbon black pigment, based on the total weight of the colorants in the black color layer.

11. The system of claim 10 wherein the total colorant concentration of carbon black in the black color layer is no greater than about 40% by weight.

12. The system of claim 11 wherein the total colorant concentration of carbon black in the black color layer is no greater than about 30% by weight.

13. The system of claim 10 wherein the binder comprises a resin having a plurality of hydroxyl groups.

14. The system of claim 13 wherein the black color layer further comprises a latent curing agent.

15. The system of claim 10 wherein the black color layer further comprises a fluorocarbon compound.

16. A method of forming a black image comprising:

assembling in mutual contact a receptor and a black donor, the black donor comprising a substrate having coated thereon at least one black color layer comprising a binder, a non-carbon black pigiment infrared absorber, and colorants, wherein the colorants comprise a non-infrared absorbing black dye or pigment and about 10% to about 50% of a carbon black pigment, based on the total weight of the colorants in the black color layer;

exposing the assembly to laser radiation to transfer a black image from the donor to the receptor in irradiated areas; and separating the donor and receptor.

17. A black donor for use in a laser addressable thermal transfer system, wherein the black donor comprises a substrate having coated thereon at least one black color layer comprising a binder, an infrared absorber comprising a tetraarylpolymethine dye, and colorants, wherein the colorants comprise a non-infrared absorbing black dye or pigment and about 10% to about 50% of a carbon black pigment, based on the total weight of the colorants in the black color layer.

18. The black donor or claim 17 wherein the total colorant concentration of carbon black in the black color layer is no greater than about 30% by weight.

19. The black donor of claim 18 wherein the black color layer further comprises a latent curing agent.

20. A laser addressable thermal transfer system comprising a receptor and a black donor, wherein the black donor comprises a substrate having coated thereon at least one black color layer comprising a binder, a latent curing agent, and colorants, wherein the binder comprises a resin having a plurality of hydroxyl groups, and wherein the colorants comprise a non-infrared absorbing black dye or pigment and about 10% to about 50% of a carbon black pigment, based on the total weight of the colorants in the black color layer.

* * * * *